United States Patent
Wendt et al.

(10) Patent No.: US 7,907,010 B2
(45) Date of Patent: Mar. 15, 2011

(54) DIGITAL AMPLIFIER

(75) Inventors: Matthias Wendt, Würselen (DE); Iain Mosely, Cleveland (GB); F. Javier Esguevillas, Cambrils (ES); Thomas Dürbaum, Baiersdorf (DE); Georg Sauerländer, Aachen (DE); Heinz Van Der Broeck, Zülpich (DE)

(73) Assignee: NXP B.V., Eindhoven (NL)

( * ) Notice: Subject to any disclaimer, the term of this patent is extended or adjusted under 35 U.S.C. 154(b) by 807 days.

(21) Appl. No.: 10/552,060

(22) PCT Filed: Mar. 25, 2004

(86) PCT No.: PCT/IB2004/050329
§ 371 (c)(1),
(2), (4) Date: Mar. 2, 2006

(87) PCT Pub. No.: WO2004/091091
PCT Pub. Date: Oct. 21, 2004

(65) Prior Publication Data
US 2007/0164814 A1      Jul. 19, 2007

(30) Foreign Application Priority Data
Apr. 7, 2003   (EP) .................................... 03100922

(51) Int. Cl.
*H03F 3/217* (2006.01)

(52) U.S. Cl. ............................ 330/251; 330/10; 330/149
(58) Field of Classification Search .................. 330/251, 330/10, 149
See application file for complete search history.

(56) References Cited

U.S. PATENT DOCUMENTS

| | | | | | |
|---|---|---|---|---|---|
| 5,513,094 | A | * | 4/1996 | Stanley | 363/98 |
| 5,559,467 | A | * | 9/1996 | Smedley | 330/10 |
| 6,028,476 | A | * | 2/2000 | Schweighofer | 330/10 |
| 6,138,042 | A | * | 10/2000 | Midya et al. | 455/571 |
| 6,646,507 | B1 | * | 11/2003 | Prokin et al. | 330/251 |
| 6,825,726 | B2 | * | 11/2004 | French et al. | 330/297 |

* cited by examiner

*Primary Examiner* — Patricia Nguyen

(57) ABSTRACT

Recently, the use of class-D audio amplifiers has become more and more widespread. In contrast to the generally employed class-AB linear amplification technology, class-D allows for improved efficiency. However, the class-D principle is known for its poor distortion characteristics. According to the present invention a digital amplifier (18) is provided for converting an audio signal to a power output, comprising a ripple suppression circuit (16) for suppressing voltage ripples in a supply voltage supplied to the bridge circuit with (6) at least one pair of switches. The ripple suppression circuit (16) suppresses ripples in the supply voltage supplied to a switch in the bridge circuit (6), which has been found to cause a major part of the distortions in the output signal of the digital amplifier (18).

17 Claims, 5 Drawing Sheets

DIGITAL AMPLIFIER

The present invention relates to the field of digital amplifiers which directly convert digital signals to a power output More specifically, the present invention relates to such digital amplifiers which are powered by power supplies having ripple and noise. In detail, the present invention relates to a digital amplifier for converting an audio signal to a power output, to a ripple suppression circuit and a method for suppressing ripples.

Several types of power-amplifier output stages have been developed. Conveniently, they were labeled as, e.g. class A amplifiers, class B amplifiers and class C amplifiers. More recently, class D amplifiers appeared. Class A, B, AB, and D are common in low-frequency audio designs and have some applications in other areas, such as servo-motor drives and RF amplification. Class C, class E and F types are usually only used in RF applications.

In recent years, in particular the class D amplifiers have become increasingly popular due to their drastically improved efficiency in contrast to the generally employed class AB linear amplification technology. Class D amplifiers are generally described in Carsten Nielsen, "High Fidelity PWM based Amplifier Concept for Active Speaker Systems with a very low Energy Consumption", ($100^{th}$ AES Convention, Copenhagen, May 1996, pre-print 4259), which is hereby incorporated by reference.

The development of class D amplifiers represents an effort to improve amplifier efficiency. Similar in scheme to a switching regulator, a class D amplifier, pulse-width-modulates the audio-input signal with a higher frequency square wave so that audio-signal information becomes the variations in pulse-width of the modulative signal. This modulation signal feeds a set of half bridge switches, usually called H-bridges, and each H-bridge consists of two power MOS-FETs. Unlike with class A or B structures, the amplifier load or the loudspeaker is placed across the legs of the bridge instead of from the output to the ground. This configuration allows the amplifier to reproduce low-frequency signals as low as 20 Hz without requiring bipolar power supplies or without introducing a DC offset in the output.

In spite of becoming more and more popular, class D audio amplifiers are known for their poor distortion characteristics. Attempts were made to filter the modulated output to remove high-frequency signals and recover the amplified input signals. Filter configurations such as two-pole Butterworth filters, two-pole Chebyshev or two-pole Bessel filters are known which either did not deliver satisfying results or caused significant efforts and costs.

It is an object of the present invention to reduce distortions in digital amplifiers.

As used herein, the term "digital amplifier" applies to an amplifier which directly converts to a power output.

According to an exemplary embodiment of the present invention, the above object may be solved with a digital amplifier for converting an audio signal to a power output comprising a power supply port, a bridge circuit with at least one pair of switches and a ripple suppression circuit. The ripple suppression circuit is configured and adapted for suppressing voltage ripples in a supply voltage supplied to the bridge circuit with at least one pair of switches via the voltage supply port. The ripple suppression circuit is arranged between the power supply port and the bridge circuit.

According to an aspect of the present invention it has been found out that a significant portion of the distortion of the digital amplifier is caused by ripples in the supply voltage of the digital amplifier. In this respect, it has to be noted that with respect to this application, the term 'ripples' is not limited to 100 Hz ripples or the like, but refers to disturbances, unwanted waviness and ripples within the 20 kHz bandwidth of the output signal. Also, the term 'suppression' includes any compensation or equalization. In particular in the case of a class D amplifier, it has been found out that one of the important distortion sources in feed forward class-D amplifiers is the supply voltage ripple at the full bridge of a class D amplifier, caused by a voltage drop due to load current changes.

Therefore, with the ripple suppression circuit according to the present invention, the distortion in digital amplifiers can be reduced significantly. Due to this, the digital amplifier according to the above exemplary embodiment of the present invention may be used for a fully digital audio amplifier without any feedback, while ensuring improved total harmonic distortion figures. In other words, with the digital amplifier according to the present invention, digital switching amplifiers are provided which may have an open loop, while having reduced distortions.

According to an exemplary embodiment of the present invention, the ripple suppression circuit comprises a linearly controlled voltage controller, which allows for output voltage variation. Advantageously, such linear control guarantees a supply voltage with minimal ripple and therefore for a output signal with reduced distortion. Advantageously, through the linearly controlled voltage controller, a variable voltage supply (VVs) may be realized without additional costs. The variable voltage supply may allow for drastic reductions of idle losses in the switching amplifier. Furthermore, advantageously, the electromagnetic interference (EMI) during normal operations may be reduced.

Another exemplary embodiment of the present invention provides for a digital amplifier where a coarse supply voltage setting is applied in front of the controlled voltage controller. Due to the only coarse supply voltage regulation, cheap and even imprecise power supplies can be used in combination with the digital amplifier while achieving reduced distortions at the amplifier output. Thus, for example a battery may be used as the power supply.

Another exemplary embodiment of the present invention provides for a digital amplifier wherein the ripple suppression circuit is configured to drive one transistor of a pair of transistors of for example a bridge configuration of a class D amplifier in the linear region of this transistor. Advantageously according to this exemplary embodiment of the present invention, voltage drops inside the power stage are compensated by taking into account all possible voltage drops including losses in copper tracks and semiconductor packages. Advantageously, according to this exemplary embodiment of the present invention, voltage drops due to a weak power supply control or small output capacitance will be compensated as well. Furthermore, advantageously, due to a reduction of power supply requirements with regard to output voltage stability, a significant cost reduction opportunity is achieved.

Further exemplary embodiments of the present invention which advantageously allow to reduce distortions in the output signal of the digital amplifier by reducing or fully compensating ripples in the power supply voltage of the digital amplifier while keeping costs low.

According to another exemplary embodiment of the present invention, the digital amplifier system according to the present invention is integrated into a module or an integrated circuit. This advantageously allows to provide for a digital amplifier with minimal dimensions while having reduced distortions. Furthermore, advantageously, this provides for the amplifier stage and the compensation circuit on one chip.

According to another exemplary embodiment of the present invention, the digital amplifier is a class D amplifier, preferable with a H-bridge and the compensation margin of the ripple suppression circuit is adapted to the output power of the amplifier.

Another exemplary embodiment of the present invention provides for a ripple suppression circuit for connection between a power supply and a class D amplifier, comprising a linearly controlled voltage controller, which may be connected between a power supply source and a H-bridge of a class D amplifier. Advantageously, while reducing requirements for the voltage stability of the output voltage of the power supply, which reduces the costs of the power supply, the ripple suppression circuit according to this exemplary embodiment of the present invention allows for a reduction of distortions in the output signal of a class D amplifier.

Another exemplary embodiment of the present invention provides for a ripple suppression circuit where one transistor of at least a pair of transistors of a class D amplifier is operated in a linear region of this transistor, allowing for reduced distortions in the output signal of the amplifier.

Exemplary embodiments of a method for suppressing ripples in a supply power of class D amplifiers allow an operation of the class D amplifiers with reduced distortions.

It may be seen as the gist of an exemplary embodiment of the present invention that ripples on a supply voltage to digital amplifiers are compensated for, causing a reduction of distortions in the output signals of these digital amplifiers. In particular, the provision of ripple cancellation modules or a linear regulator in the supply lines to the digital amplifier, in particular to the H-bridge of, for example, a class D amplifier allows to reduce distortions in the amplifier output signal. Furthermore, the control of a transistor of a switching half-bridge, such that it is linearly controlled, allows for an improved output signal.

These, and other aspects of the present invention are apparent and will be elucidated with reference to the embodiments described hereinafter and with reference to the following drawings.

In the following, exemplary embodiments of the present invention will be described with reference to the Figures. The digital amplifiers depicted in FIGS. 1, 2, 3, 4, 5 and 6 are class D amplifiers, having a full bridge, usually referred to as H-bridge. In spite of the fact that the present invention will be described with reference to exemplary embodiments of class D amplifiers, it is apparent to the skilled person that the present invention is not limited to class D amplifiers, but is applicable to any kind of digital amplifier, where ripples in the power supply voltage cause problems such as distortions in the output signal of the amplifier.

Figure 1:
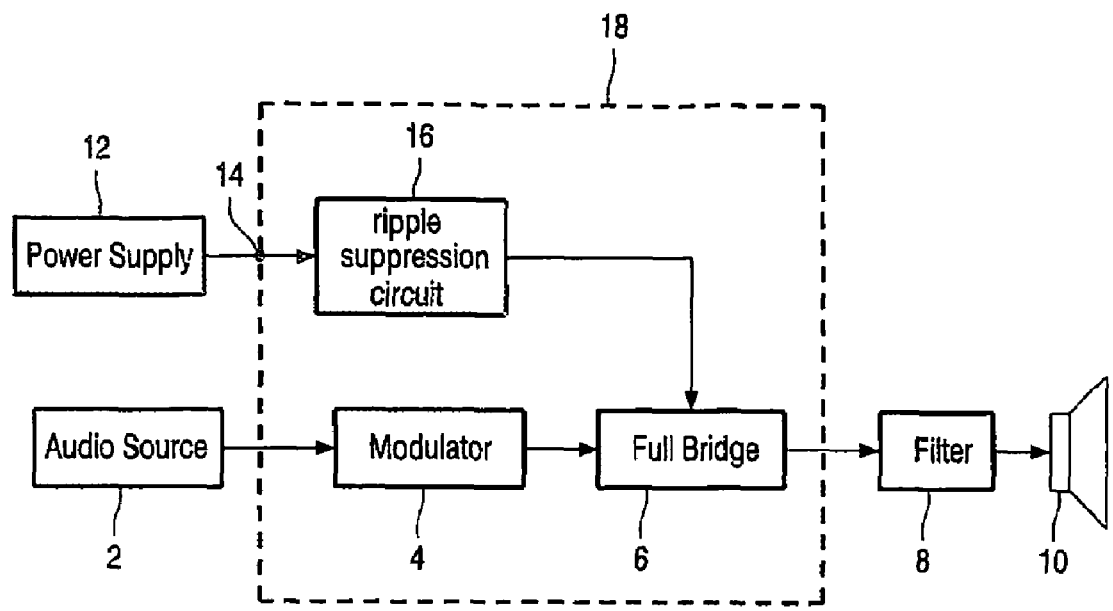
FIG. 1 shows a schematic diagram of a first exemplary embodiment of a digital amplifier for converting an audio signal to a power output according to the present invention.

FIG. 1 shows a simplified schematic block diagram of a first exemplary embodiment of a digital amplifier according to the present invention for converting an audio signal to a power output. Reference numeral 2 in FIG. 1 designates an audio source which outputs an audio signal to a modulator 4. The modulator 4 pulse-width modulates the audio signal with a higher frequency square wave so that the signal output at the output of the modulator 4 includes the audio-signal information as variations in pulse-width of the modulated signal. This modulated signal feeds a set of half bridge switches, usually called H-bridges 6. Usually, each H-bridge consists of two power MOSFETs. The output of the bridge 6 is fed into a filter for filtering the signal before the output signal is applied to a loudspeaker 10. Unlike with class A or B structures, the amplifier load, i.e. the loudspeaker 10 is connected across to the legs of the bridge 6 instead of from the output to the ground. It has to be noted that the present invention may also be implemented in class D halfbridge architectures. In case the present invention is applied to class D halfbridge architectures, the speaker is then connected to half supply or by means of a series capacitance.

Reference numeral 12 designates a power supply such as a switching power supply or even a battery. The power supply 12 feeds the power supply voltage via a power supply port 14 to the switches of the bridge 6. As may be taken from FIG. 1, according to the present invention there is a ripple suppression circuit 16 in the power supply line between the power supply port 14 and the bridge 6. The ripple suppression circuit 16 is configured for suppressing voltage ripples in the supply voltage supplied to the bridge circuit 6.

According to an exemplary embodiment of the present invention, the modulator 4, the full bridge 6 and the ripple suppression circuit 16 may be configured into one module or integrated circuit 18. Such integrated circuit (IC) or module usually constitutes the digital amplifier.

According to this exemplary embodiment of the present invention, use is made of the new and inventive discovery such that a significant part of the distortions at the output of the bridge 6, i.e. the output of the digital amplifier can be reduced by an enhancement of the supply ripple rejection. Due to the ripple suppression circuit 16 according to the present invention, advantageously a reduction of power supply requirements with regard to output ripples may be made possible, which in turn may give a significant cost reduction opportunity. Furthermore, the present invention enables the provision of an essentially distortion free digital open loop switching amplifier.

Figure 2:
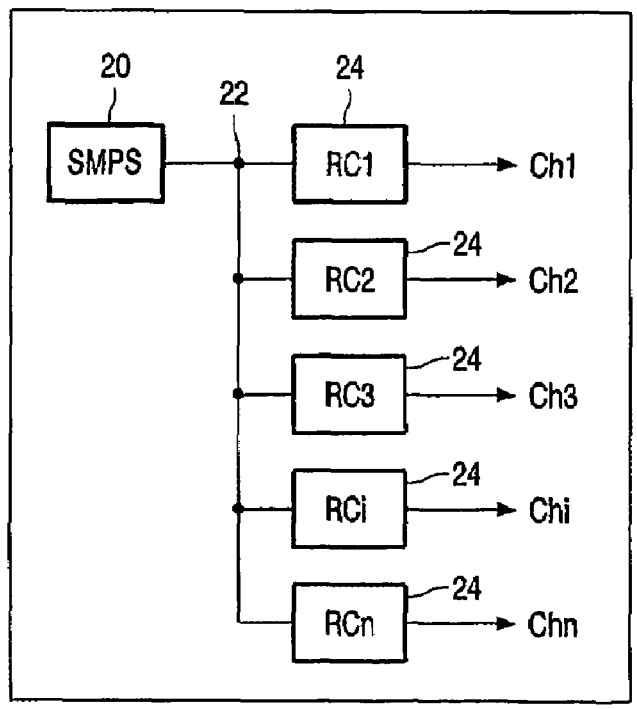
FIG. 2 shows a schematic diagram of a second exemplary embodiment of a digital amplifier for converting an audio signal to a power output according to the present invention.

FIG. 2 shows a simplified schematic block diagram of a second embodiment of the present invention. Reference numeral 20 in FIG. 2 designates a power supply such as a switching power supply SMPS which is connected to a power supply port 22 of the digital amplifier. According to this exemplary embodiment of the present invention, for each channel Ch 1, Ch 2, Ch 3, Chi and Chn, a ripple cancellation module RC 1, RC 2, RC 3, RCi, RCn is provided. The ripple cancellation modules are designated with reference numeral 24. According to a variant of this second exemplary embodiment of the present invention, these ripple cancellation modules 24 may be configured by means of voltage suppression circuits. These voltage suppression circuits fulfill two tasks. Firstly, they ensure the necessary suppression of voltage fluctuations in the supply voltage supplied to the switches of the amplifier. Secondly, they decouple the individual audio channels Chl to Chn. The voltage suppression circuit 24 may be realized by means of linear controllers or linear regulators, which depending on the applied currents may be standard or low drop linear controls or regulators. However, since actually no control or regulation of the supply voltage is necessary, since the DC value of the supply voltage is controlled by means of the SMPS 20, according to a variant of this exemplary embodiment of the present invention, the ripple cancellation modules 24 may also be realized by means of variable resistors, the resistance of which may be controlled down to only a few mΩ. Such variable resistors allow to equalize the voltage drop at the parasitic supply lines, which is dependent on the applied load. Also, advantageously, these variable resistors allow for a reduction or equalization of a waviness or ripples due to the switching in the SMPS and of transient voltage fluctuations or jitter caused by load variations. In other words, a modulation of the resistance in the supply line by means of the variable resistors in the ripple cancellation modules 24 allows for an avoidance of load dependent voltage drops in the supply voltage supplied to the switches.

Such a variable resistor may be implemented by means of a MOSFET, having a suitable gate drive. Advantageously, in case of a low ohmic MOSFET, the system effectiveness of the overall digital amplifier remains almost unchanged.

Advantageously, this exemplary embodiment of the present invention as depicted in FIG. 2 allows for an improved sound quality and a very good channel separation in the case of full digital audio amplifiers, even if only one power supply is used. Furthermore, advantageously, the efforts for filtering the output of the power supply can be reduced significantly, since the actual suppression of voltage fluctuations is taken care of by means of the ripple cancellation modules 24.

Figure 3:
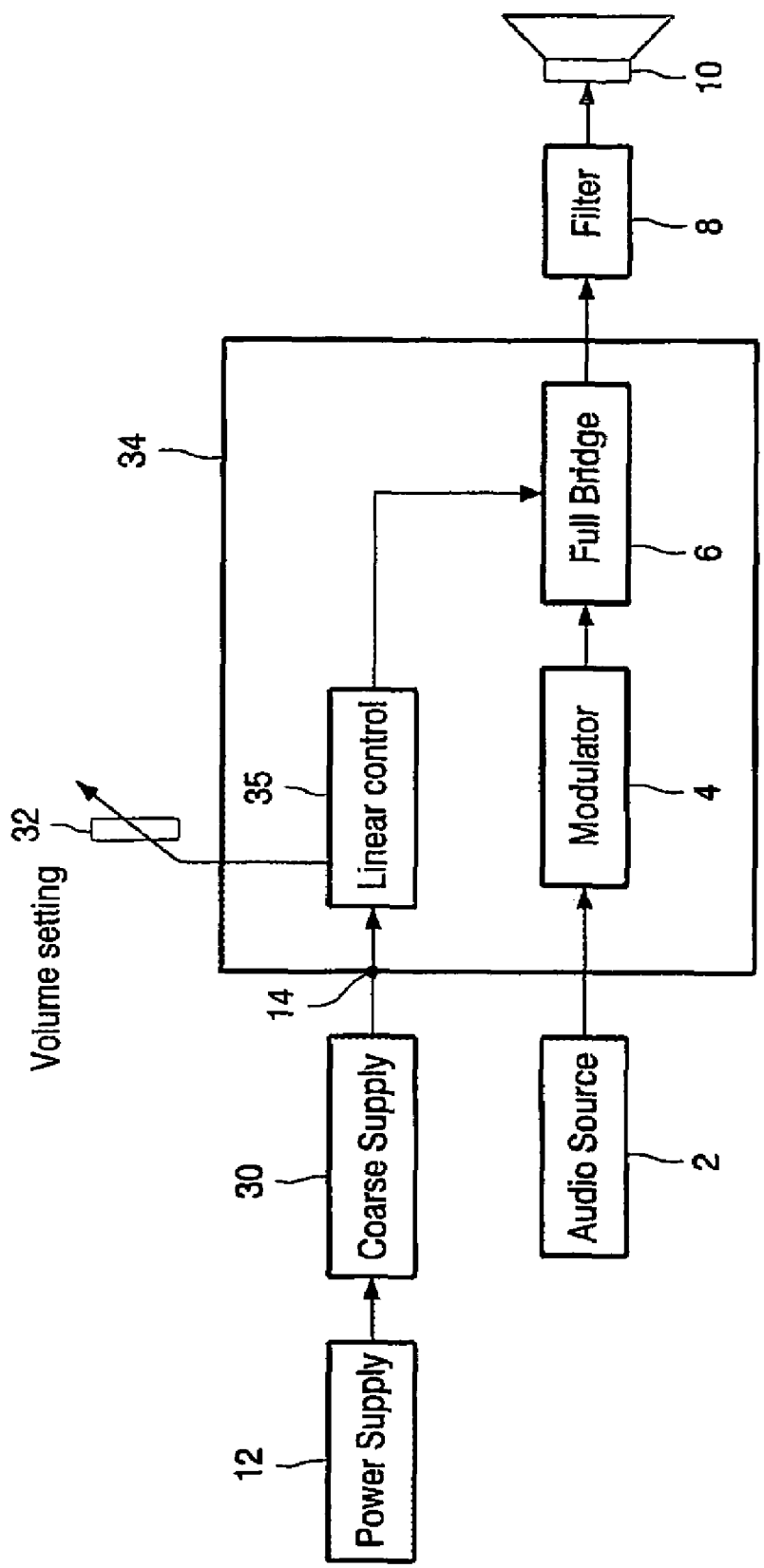
FIG. 3 shows a schematic diagram of a third exemplary embodiment of a digital amplifier for converting an audio signal to a power output according to the present invention.

FIG. 3 shows a simplified schematic block diagram of a third exemplary embodiment of a digital amplifier according to the present invention. In FIG. 3, the same reference numerals are used as in FIG. 1 to designate the same or corresponding elements. Reference numeral 30 designates a coarse supply which includes a very coarse voltage control, which output voltage, i.e. supply voltage is supplied to the bridge 6 and which includes ripples and is unstable. This coarse supply voltage is input to the digital amplifier 34 via the power supply port 14 of the digital amplifier 34. Reference character 35 designates a linear control, which is arranged between the power supply port 14 and the switches of the bridge 6. A detailed description of where and how the linear control 35 is connected to the bridge 6 will be made with reference to FIG. 4. Reference numeral 32 designates a volume setting by means of which a person operating the digital amplifier may set the volume of the audio signal output by the loudspeaker 10, i.e. the signal level output by the switches of the bridge 6. In a multiple channel amplifier system, the linear control may, according to an aspect of the present invention, be realized separately for each channel or channel cluster. Advantageously, this may allow the user to control differences between the channel, e.g. the left-right balance or back-forward control by means of adjustment of the linear control 35 by means of the volume setting 32.

As in the preceding embodiments, the third exemplary embodiment depicted in FIG. 3 makes use of the new and inventive discovery, that by improving the supply ripple rejection of the digital amplifier 34, the distortion characteristics of the digital amplifier 34 can be improved. As may be taken from FIG. 3, the linear control 35, which may be also implemented by means of a linear regulator, may be provided. The linear control 35 allows for output voltage variation such that the voltage supplied to the switches of the bridge 6 can be controlled. This linear control 35 advantageously allows for a clean supply voltage, having only minimal ripple. Due to the linear control 35, a variable supply voltage (VVS) may be used without additional costs. The variable voltage supply offers drastic reductions of idle losses in the switching amplifier. Furthermore, the electromagnetic emission (EMI) during normal operations, may be reduced significantly. The control margin of the linear control 35 at the highest output voltage setting may even be 0 (reducing the losses to a minimum) because distortion requirements at peak power are usually less stringent in audio applications. Preferably, the linear control 35 is implemented by means of a linear output voltage regulator, such as linear control 35, where the output level can be varied in a wide range to control the amplifier output power (volume control). As indicated in FIG. 3, the linear control 35, the modulator 4 and the full bridge 6 may be incorporated into one module or integrated circuit.

Figure 4:
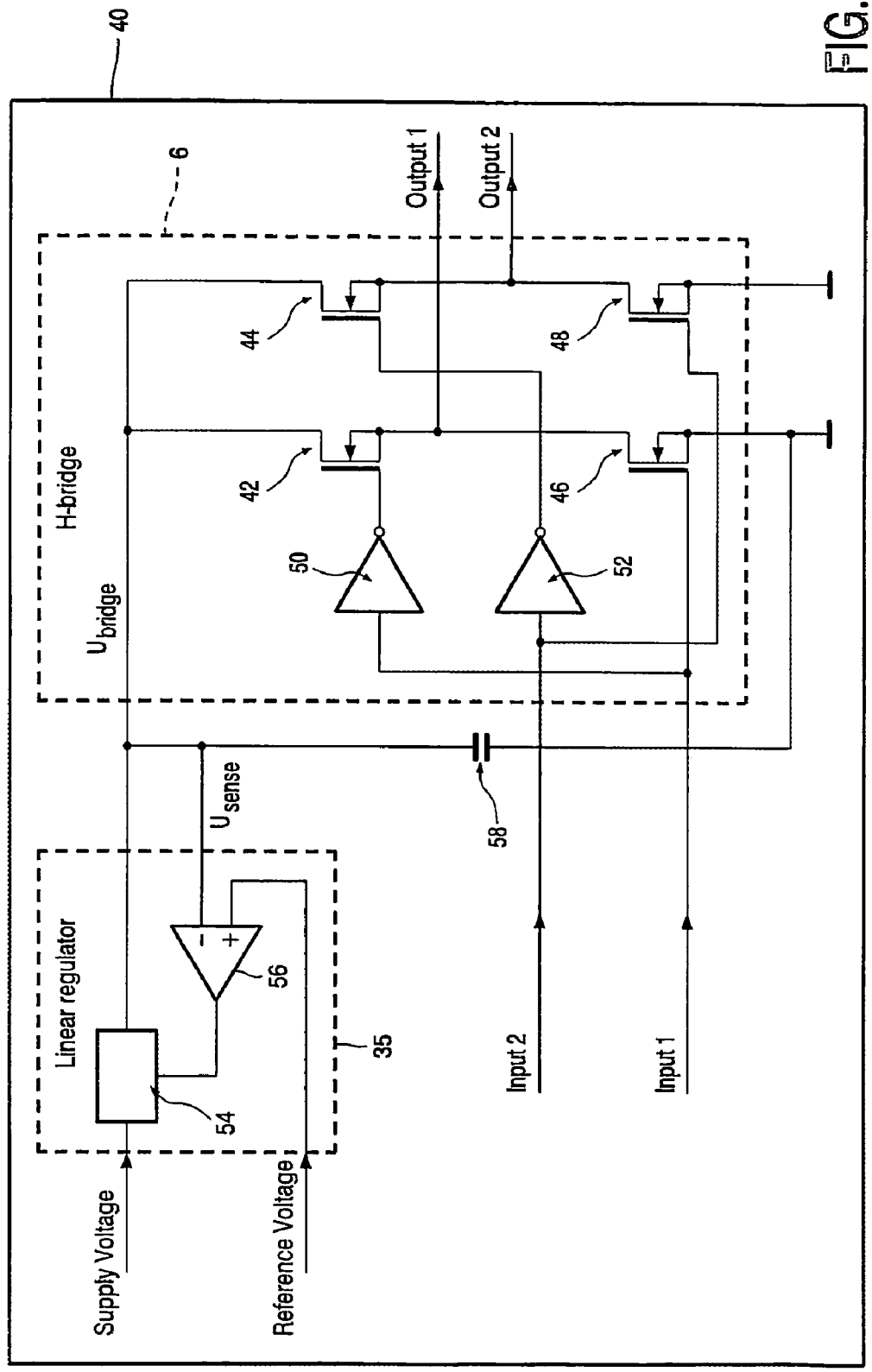
FIG. 4 shows a simplified circuit diagram of the digital amplifier of FIG. 3.

FIG. 4 shows a simplified circuit diagram of the linear control 35 and the bridge 6 according to an exemplary embodiment of the present invention. As indicated by frame 40, according to an aspect of the present invention, the linear regulator and the bridge 6 may be integrated together in one module or integrated circuit. The H-bridge 6 comprises four switches (transistors) 42, 44, 46 and 48 which are in a H-configuration. Usually, the two upper switches 42 and 44 are referred to as high side switches, whereas the switches 46 and 48 are referred to as low side switches. Furthermore, there is provided a first driver 50 arranged between a line with the input signal "input 1", which is fed to the gate of the switch 46 and the gate of the switch 42. Furthermore, there is provided a second driver 52 which input signal is the signal "input 2" and which output is provided to the gate of switch 44. Also, the signal "input 2" is provided to the gate of switch 48. As may be taken from FIG. 4, the output signals output 1 and output 2 are taken across the legs of the bridge. The general configuration and operation of a H-bridge is known in the art and therefore will not be described in detail here. As may be taken from FIG. 4, the linear control 35 comprises a linear regulator 54 and a comparator or differential amplifier 56. One input of the comparator or differential amplifier 56 is connected to the output line of the linear control 35 between the output of the linear control 35 and the input of the bridge 6. In other words, this input is connected to the driving voltage $U_{drive}$ of the bridge 6. Also, this input of the comparator or differential amplifier 56 is connected via a capacitor 58 to the ground reference of the bridge 6. The voltage signal at this input of the comparator or differential amplifier 56 is referred to a as $U_{sense}$. The other input of the comparator or differential amplifier 56 receives a reference voltage. The output of the differential amplifier or comparator 56 is input to the linear regulator 54, which also receives the supply voltages input.

The linear control 35 monitors the supply voltage for the H-bridge 6 and corrects any differences compared against the reference voltage. The reference voltage signal is the means to control the supply voltage of the H-bridge. For a fixed modulation depth at the input signals input 1 and input 2, this reference signal thus allows to control the output power of the output signals output 1 and output 2. Preferably, the sense signal $U_{sense}$ should be connected as near as possible to the switches 42 and 44 of the H-bridge, where the voltage $U_{bridge}$ needs to be well controlled.

During operation of the linear control 35, there occurs a voltage drop over the linear regulator 54. This voltage drop over the linear regulator 54 generates losses. These losses are linearly dependent on the load current. In other words, as long as the bridge voltage is low, the load currents are low and thus the losses in the regulator are also low. Due to this relation, advantageously, the losses at high output volume occur at a high current through the regulator, whereas there is a low voltage drop. At a low volume, there will be a high voltage drop, but only low current.

Advantageously, according to an aspect of the present invention, the control margin for high output power at the output power signals output 1 and output 2 should be selected minimal. By this, very high efficiency can be achieved. This means that in an extreme case, the linear regulator 54 is arranged such that there is no compensation for supply ripples at the highest output power setting. In other words, at high power, the total harmonic characteristics will become worse, compared to reduced output power. However, this fits perfectly to the behavior of conventional amplifiers, where the distortion goes up at excessive output power. Thus, advantageously, this does not have any negative effect for audio applications.

According to an aspect of the present invention, the coarse voltage setting, which is controlled by the volume control may be used to adjust the input voltage in steps according to the volume setting. In other words, a two step control may be realized. This allows to further reduce losses in the linear regulator 54.

According to another aspect of this exemplary embodiment of the present invention, a simple SMPS could be used as a coarse switched mode regulator in a step before the linear regulator 54, which, due to its topology, allows only for compensation of input voltage variations and not for load variations. Advantageously, due to the provision of such coarse switched mode regulator before the linear control 35, the control margin can be held minimal and thereby a very high efficiency can be achieved.

Advantageously, the linear control 35 can be used for more than one channel in a multi-channel application, for example, the linear control 35 may be used for the left side and the right side in a stereo amplifier. However, in order to achieve a minimal coupling of the channels, separate regulators may be advantageous, also for excessive power, a linear control per channel may provide for a better loss and heat distribution.

Figure 5:
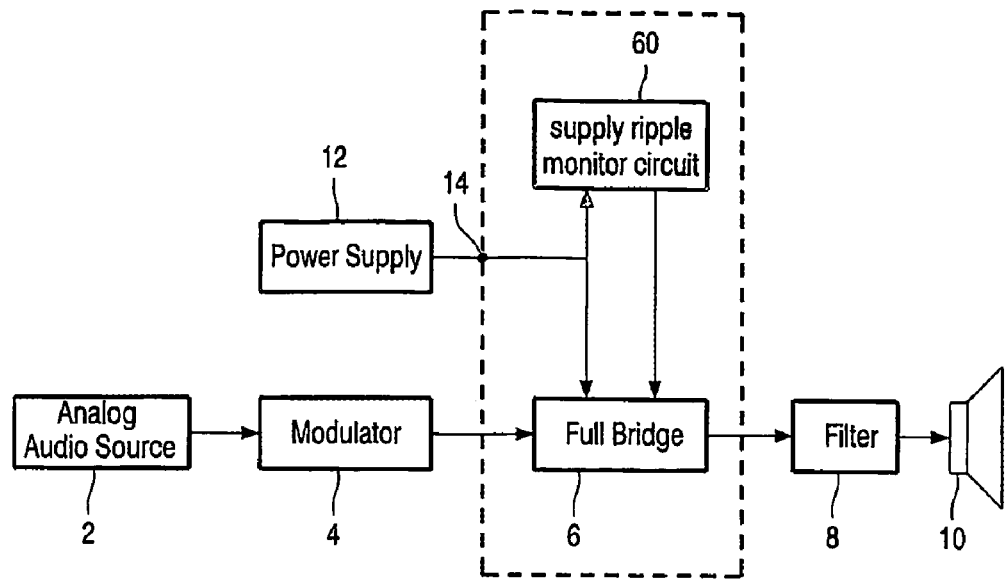
FIG. 5 shows a schematic diagram of a fourth exemplary embodiment of a digital amplifier for converting an audio signal to a power output according to the present invention.

FIG. 5 shows a simplified schematic block diagram of a fourth exemplary embodiment of a digital amplifier according to the present invention. In the embodiment of FIG. 5, the same reference numerals are used as in FIG. 1 to designate the same or corresponding elements. Reference character 60 in FIG. 5 designates a supply ripple monitor circuit, which is connected between the power supply 12 and the bridge 6. The supply ripple monitor circuit 60 is arranged such that is measures the supply voltage supplied by the power supply 12 and controls one of the switches of the bridge 6 in the linear region. Preferably, the supply ripple monitor circuit 60 controls one of the low side switches (for example switches 46 or 48 in FIG. 4) in the linear region. Advantageously, by such control according to the present invention, voltage drops in the supply voltage supplied by the power supply 12 due to load current changes are compensated for inside the power stage. Advantageously, this allows for taking into account all possible voltage drops, including losses in copper tracks and semiconductor packages. Of course, voltage drops due to a weak power supply control or small output capacitors may be compensated as well. Advantageously, this allows for a very cheap digital amplifier having low distortions, in contrast to known solutions, where massive output capacitors and supply wiring with wide copper tracks are necessary. Apart from being more cost efficient, the compensation by means of the supply ripple monitor circuit 60 according to the present invention also allows for compensation of voltage drops in the wiring.

Figure 6:
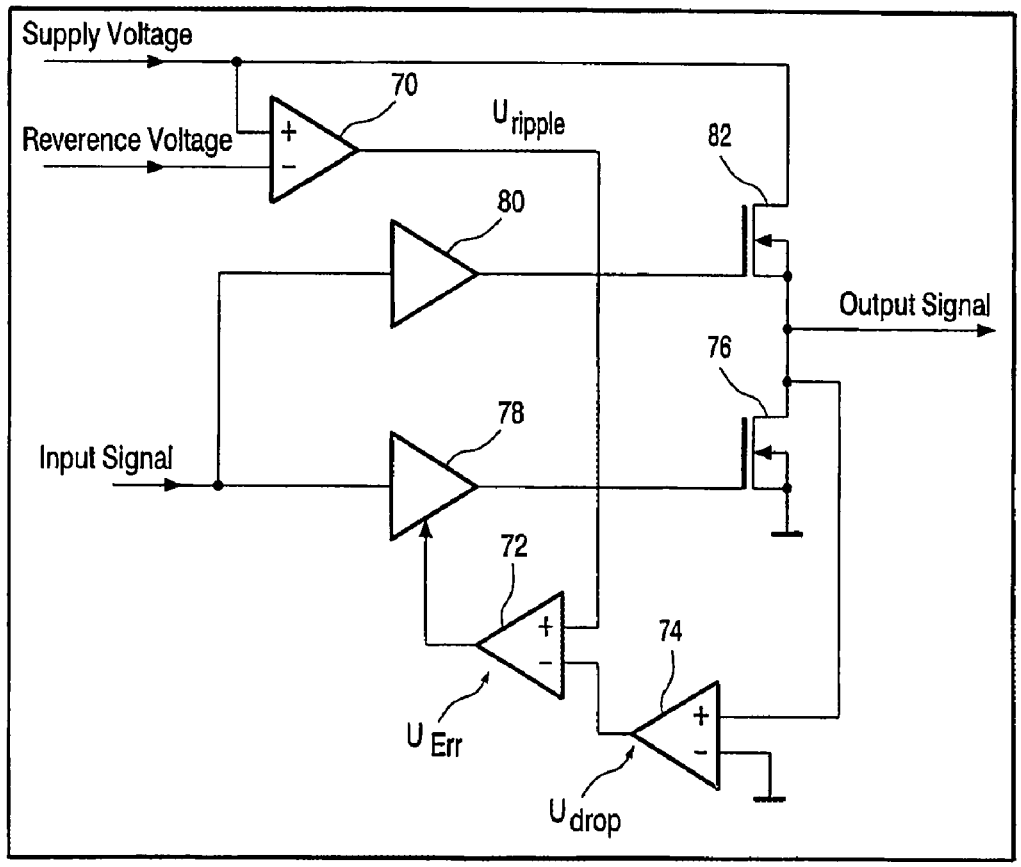
FIG. 6 shows a simplified circuit diagram of the digital amplifier of FIG. 5.

FIG. 6 shows a simplified circuit diagram depicting the configuration of the supply ripple monitor circuit 60 according to an exemplary embodiment of the present invention for one half bridge.

Reference numeral 70 designates a differential amplifier with the gain of K1, which measures the voltage ripple on the supply voltage against a reference voltage and generates a signal $U_{ripple}$ which is output to another differential amplifier 72. As long as the voltage ripple on the supply voltage is smaller than a compensation margin, the signal $U_{ripple}$ is positive.

Reference numeral 74 designates a further differential amplifier with the gain of K1, (the same gain as the differential amplifier 70) which measures the voltage drop over a low side switch 76. The output signal of the differential amplifier 74 is referred to as $U_{drop}$. This voltage $U_{drop}$ is compared to the voltage signal $U_{ripple}$ by means of the differential amplifier 72. The output signal of the differential amplifier 72 based on a comparison of $U_{ripple}$ to $U_{drop}$ is referred to as error signal $U_{Err}$. The error signal $U_{Err}$ is fed into a low side gate driver 78 to control the gate voltage of the low side switch 76 on the basis of the error signal $U_{Err}$.

Reference numeral 80 designates a high side gate driver for driving the gate voltage of a high side switch 82.

Figure 7:
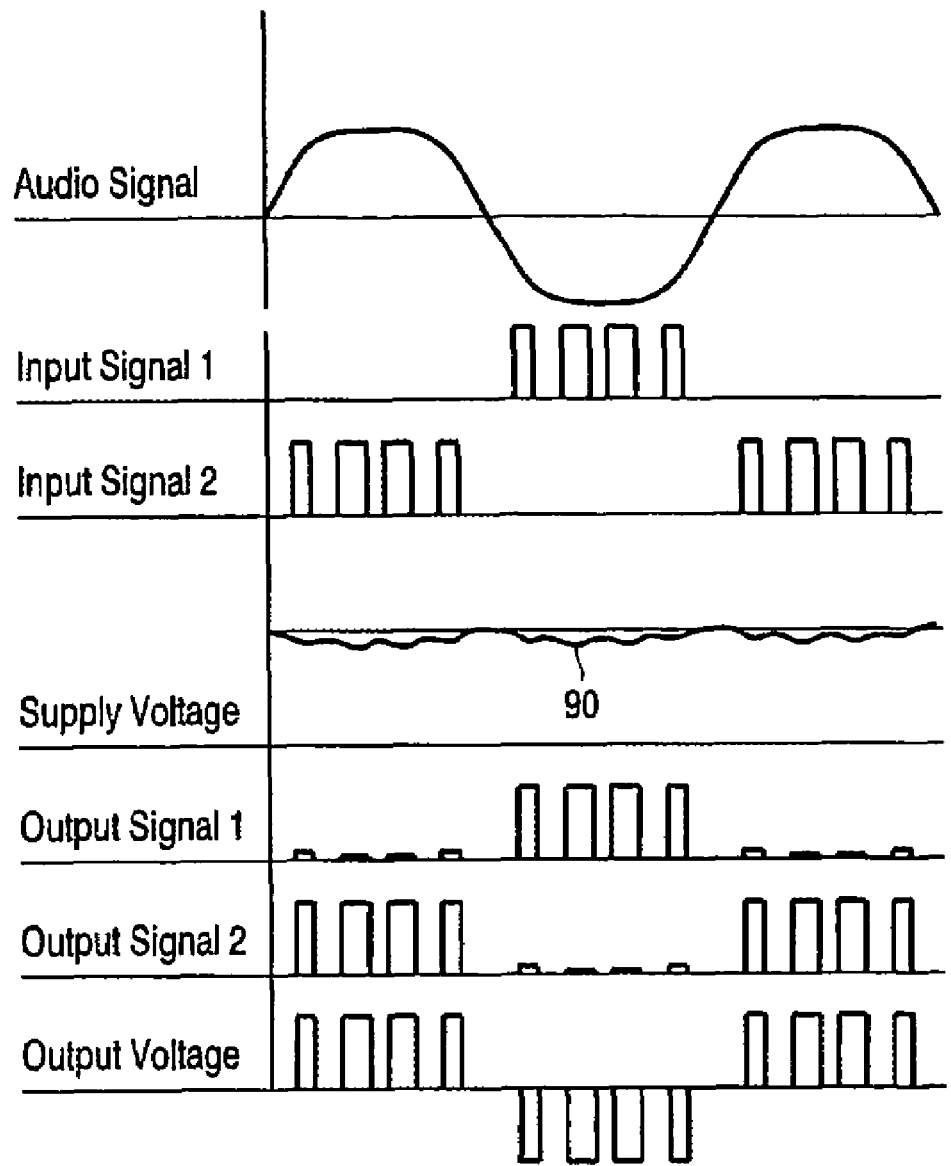
FIG. 7 is a timing chart, showing timings of the digital amplifier of FIG. 4.

FIG. 7 shows a timing chart depicting signals in the digital amplifier when the supply ripple monitor circuit 60 according to the fourth embodiment of the present invention is applied to a H-bridge such as the one depicted as bridge 6 in FIG. 4.

The signal names used in FIG. 7 are the same as the signal names used in FIGS. 4 to 6.

The first chart in FIG. 7 shows the audio signal output by the analog audio source 2 to the modulator 4.

The subsequent two timing charts show the respective input signals, input signal 1 and input signal 2, input into the bridge 6 by means of the modulator 4.

The subsequent chart depicts the supply voltage, wherein the horizontal line depicts the ideal voltage over the time, whereas line 90 shows the actual supply voltage including ripples.

The subsequent two charts show the output signals, output signal 1 and output signal 2, output from the bridge 6. In spite of the fact that the representation in FIG. 7 is exaggerated, it is obvious that the output signal 1 and output signal 2 are influenced by the ripple on the supply voltage. In particular, a comparison of the output signal 1 to the input signal 1 and of the output signal 2 to the input signal 2 shows that the output signals show distortions. However, due to the control of the low side switch in the linear region to compensate for the supply variations measured by means of the differential amplifier 70 in accordance with the present invention, the distortions shown on the output signal 1 and the output signal 2 are such that when both output signals, output signal 1 and output signal 2 are combined to one output signal which is provided to the loudspeaker 10, the distortions eliminate or compensate each other. Thus, as shown in the subsequent chart showing the output voltage, the output voltage is free of distortions.

According to an aspect of the fourth embodiment of the present invention, the reference-input-signal is chosen such that the supply voltage will never become lower than this reference voltage. According to the present invention, the selection of the compensation margin is made on the basis of the control margin and a minimization of the losses.

According to an advantageous aspect of the fourth embodiment shown in FIGS. 5 and 6, an additional filter for the error signal may be used to average the error information over a number of switching cycles to reduce the band width requirements for the compensation control loop. This does not have a negative effect on the Total Harmonic Distortion (THD) because this is dominated by the effects of supply ripple in the audio band. Here, especially the low frequency ripples are important. For higher ripple frequencies (above 5 kHz), the higher harmonics do not fall inside the measurement band and do not contribute to the THD.

According to the fourth exemplary embodiment shown in FIGS. 5 and 6, the supply voltage is continuously monitored and compared against the reference voltage. However, according to a variant of this exemplary embodiment of the present invention, a similar functionality may be achieved by means of a sample and hold function block for the supply voltage signal. Then, the supply voltage is sampled for every switching cycle, resulting in a constant voltage drop over the load side switch during a cycle. Supply voltage variations during the switching cycles have no influence. Advantageously, this allows for a reduction of the susceptibility to switching noise on the supply voltage line.

Also, according to another variant of the fourth exemplary embodiment of the present invention, an adaptive tracking of the supply voltage may be used to adjust the reference voltage automatically. Advantageously, this is performed in a way that for a given compensation margin, the losses are kept minimal.

According to an aspect of this variant, such self adaptive system is provided with an automatic setting of the margin. The load currents mainly cause the supply ripple. Furthermore, low output voltages will result in low output currents. At low load currents, the compensation margin can be smaller than at high currents. Therefore, according to this aspect of the present invention, it is advantageous to control the margin together with the output volume of the amplifier in order to minimize losses.

According to another aspect of the fourth embodiment, the supply ripple monitor circuit 60 may be a part of the gate drive circuit. Preferably, the supply ripple monitor circuit 60 is inside an integrated circuit to reduce the component count.

According to another aspect of the fourth exemplary embodiment of the present invention, an alternative supply ripple monitor circuit 60 may also be provided for the high side switch. Therefore, according to this aspect of the present invention, instead of avoiding that the low side switch is not running in saturation, a supply ripple monitor circuit may be provided for the high side switch to avoid that the high side switch is operated in saturation.

The invention claimed is:

1. Digital amplifier for converting an audio signal to a power output comprising:
a power supply port;
a bridge circuit with at least one pair of switches; and
a ripple suppression circuit for suppressing voltage ripples in a supply voltage supplied to the bridge circuit with at least one pair of switches via the voltage supply port;
wherein the ripple suppression circuit is arranged between the power supply port and the bridge circuit with at least one pair of switches;
wherein the switches are transistors;
wherein the ripple suppression circuit is connected to a first transistor of the at least one pair of transistors; and
wherein the ripple suppression circuit is configured to drive the first transistor of the at least one pair of transistors in a linear region of the first transistor.

2. The digital amplifier according to claim 1, wherein the ripple suppression circuit comprises a linearly controlled voltage controller.

3. The digital amplifier according to claim 2, wherein the controlled voltage controller is for multiple channels of the amplifier; wherein the least one pair of switches is configured as an H-bridge; and wherein a coarse supply voltage setting is applied in front of the controlled voltage controller.

4. The digital amplifier of claim 1, wherein the ripple suppression circuit is configured to generate an error signal on the basis of a comparison of a voltage at the power supply port to a reference voltage and a voltage drop over a second transistor of the at least one pair of transistors and to control a gate voltage of the first transistor on the basis of the error signal to drive the first transistor in the linear region.

5. The digital amplifier of claim 1, wherein the ripple suppression circuit comprises a band pass filter for limiting the bandwidth of the ripple suppression circuit to reduce requirements for a control loop; and wherein the ripple suppression circuit further comprises a sample and hold circuit for sampling a voltage at the power supply port at duty cycles.

6. The digital amplifier of claim 1, further comprising a reference voltage source which generates the reference voltage on the basis of a voltage at the power supply port to ensure a required compensation margin.

7. The digital amplifier according to claim 1, wherein at least one pair of switches comprises power transistors and wherein the power transistors and the ripple suppression circuit are integrated in a module or integrated circuit. supply port to ensure a required compensation margin.

8. The digital amplifier according to claim 1, wherein a compensation margin of the ripple suppression circuit is adapted to an output power of the amplifier such that it is low at a high output power of the amplifier and wherein the digital amplifier is a class D amplifier.

9. A ripple suppression circuit for connection between a power supply and a class D amplifier, the class D amplifier including at least one pair of transistors, wherein the ripple suppression circuit is connected to a first transistor of the at least one pair of transistors, and wherein the ripple suppression circuit is configured to drive the first transistor of the at least one pair of transistors in a linear region of the first transistor.

10. Method for suppressing ripples in a power supply voltage of a class D amplifier, wherein the class D amplifier includes at least one pair of transistors, the method comprising the step of:
driving of a first transistor of the at least one pair of transistors in a linear region of the first transistor.

11. Digital amplifier for converting an audio signal to a power output comprising:
a power supply port;
a bridge circuit with at least one pair of switches; and
a ripple suppression circuit for suppressing voltage ripples in a supply voltage supplied to the bridge circuit with at least one pair of switches via the voltage supply port;
wherein the ripple suppression circuit is arranged between the power supply port and the bridge circuit with at least one pair of switches; and
wherein the ripple suppression circuit comprises a linearly controlled voltage controller;
wherein the switches are transistors;
wherein the ripple suppression circuit is connected to a first transistor of the at least one pair of transistors; and
wherein the ripple suppression circuit is configured to drive the first transistor of the at least one pair of transistors in a linear region of the first transistor;

wherein the ripple suppression circuit is configured to generate an error signal on the basis of a comparison of a voltage at the power supply port to a reference voltage and a voltage drop over a second transistor of the at least one pair of transistors and to control a gate voltage of the first transistor on the basis of the error signal to drive the first transistor in the linear region.

12. The digital amplifier according to claim 11, wherein the switches are transistors;
wherein the ripple suppression circuit is connected to a first transistor of the at least one pair of transistors; and
wherein the ripple suppression circuit is configured to drive the first transistor of the at least one pair of transistors in a linear region of the first transistor;
further comprising a reference voltage source which generates the reference voltage on the basis of a voltage at the power supply port to ensure a required compensation margin.

13. The digital amplifier according to claim 11, wherein at least one pair of switches comprises power transistors and wherein the power transistors and the ripple suppression circuit are integrated in a module or integrated circuit.

14. The digital amplifier according to claim 11, wherein a compensation margin of the ripple suppression circuit is adapted to an output power of the amplifier such that it is low at a high output power of the amplifier and wherein the digital amplifier is a class D amplifier.

15. Digital amplifier for converting an audio signal to a power output comprising:
a power supply port;
a bridge circuit with at least one pair of switches;
a ripple suppression circuit for suppressing voltage ripples in a supply voltage supplied to the bridge circuit with at least one pair of switches via the voltage supply port;
wherein the ripple suppression circuit is arranged between the power supply port and the bridge circuit with at least one pair of switches; and
a reference voltage source which generates the reference voltage on the basis of a voltage at the power supply port to ensure a required compensation margin.

16. Digital amplifier for converting an audio signal to a power output comprising:
a power supply port;
a bridge circuit with at least one pair of switches; and
a ripple suppression circuit for suppressing voltage ripples in a supply voltage supplied to the bridge circuit with at least one pair of switches via the voltage supply port;
wherein the ripple suppression circuit is arranged between the power supply port and the bridge circuit with at least one pair of switches;
wherein the ripple suppression circuit comprises a linearly controlled voltage controller;
wherein the switches are transistors;
wherein the ripple suppression circuit is connected to a first transistor of the at least one pair of transistors; and
wherein the ripple suppression circuit is configured to drive the first transistor of the at least one pair of transistors in a linear region of the first transistor;
further comprising a reference voltage source which generates the reference voltage on the basis of a voltage at the power supply port to ensure a required compensation margin.

17. Digital amplifier for converting an audio signal to a power output comprising:
a power supply port;
a bridge circuit with at least one pair of switches; and
a ripple suppression circuit for suppressing voltage ripples in a supply voltage supplied to the bridge circuit with at least one pair of switches via the voltage supply port;
wherein the ripple suppression circuit is arranged between the power supply port and the bridge circuit with at least one pair of switches;
wherein the ripple suppression circuit comprises a linearly controlled voltage controller;
wherein the linearly controlled voltage controller is for multiple channels of the amplifier;
wherein the least one pair of switches is configured as an H-bridge; and
wherein a coarse supply voltage setting is applied in front of the linearly controlled voltage controller.

* * * * *